United States Patent [19]

Buurma et al.

[11] 4,405,871

[45] Sep. 20, 1983

[54] CMOS RESET CIRCUIT

[75] Inventors: Gerald B. Buurma; John M. Jorgensen, both of San Jose, Calif.

[73] Assignee: National Semiconductor Corporation, Santa Clara, Calif.

[21] Appl. No.: 145,416

[22] Filed: May 1, 1980

[51] Int. Cl.³ .................... H03K 5/153; H03K 17/20; H03K 17/687; H02J 13/00

[52] U.S. Cl. .................................... 307/594; 307/362; 307/597

[58] Field of Search ............... 307/362, 594, 595, 597, 307/200 B; 328/48

[56] References Cited

U.S. PATENT DOCUMENTS

| | | | |
|---|---|---|---|
| 3,895,239 | 7/1975 | Alaspa | 307/594 |
| 4,013,902 | 3/1977 | Payne | 307/594 |
| 4,103,187 | 7/1978 | Imamura | 307/200 B X |
| 4,140,930 | 2/1979 | Tanaka | 307/594 X |
| 4,210,829 | 7/1980 | Wong et al. | 307/594 X |
| 4,296,338 | 10/1981 | Thomas | 307/594 X |
| 4,300,065 | 11/1981 | Remedi et al. | 307/594 X |

OTHER PUBLICATIONS

Hanchett, "Turn-On Reset Pulse Circuits", RCA Technical Notes, TN No.: 927, 4 pp.; 3/28/73.

Primary Examiner—Larry N. Anagnos
Attorney, Agent, or Firm—Paul J. Winters; Gail W. Woodward; Neil B. Schulte

[57] ABSTRACT

A CMOS integrated circuit power-on reset circuit has two cascaded threshold detectors for independently sensing the supply voltage attaining an amplitude sufficient to operate N and P-channel devices respectively and for providing a reset signal in response to the supply voltage meeting both conditions.

11 Claims, 14 Drawing Figures

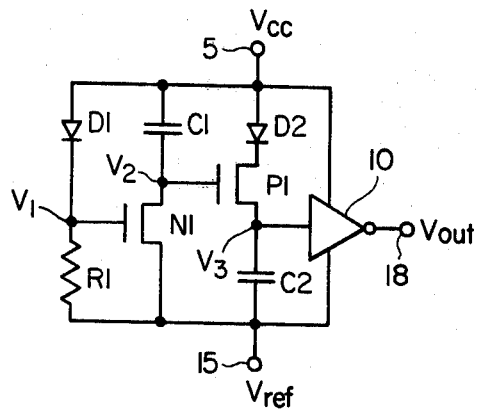
FIG_1
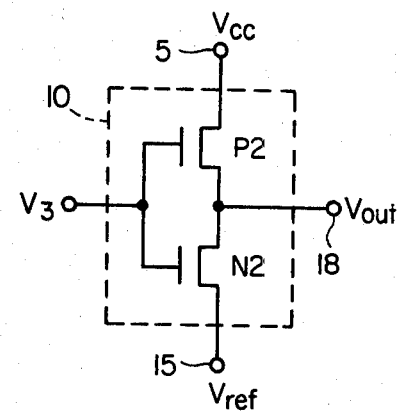
FIG_3
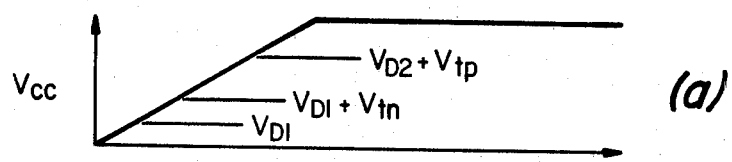
(a)
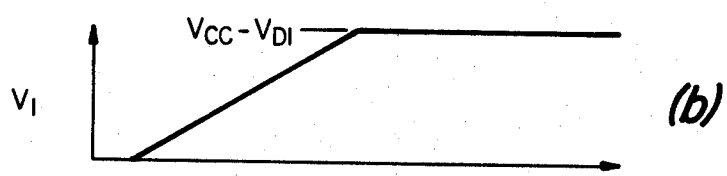
(b)
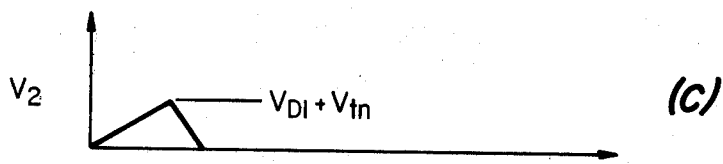
(c)
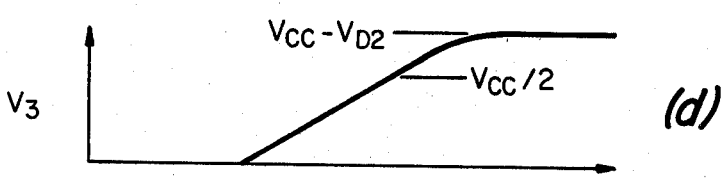
(d)
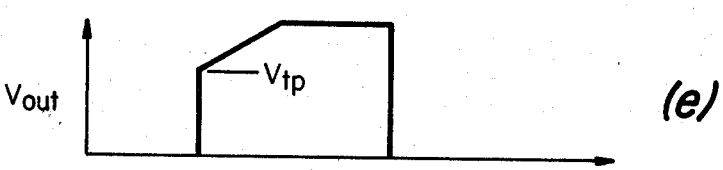
(e)
FIG_2

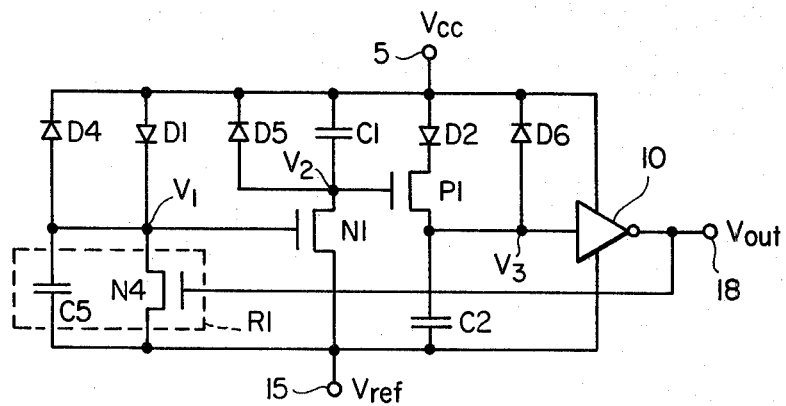
FIG_4
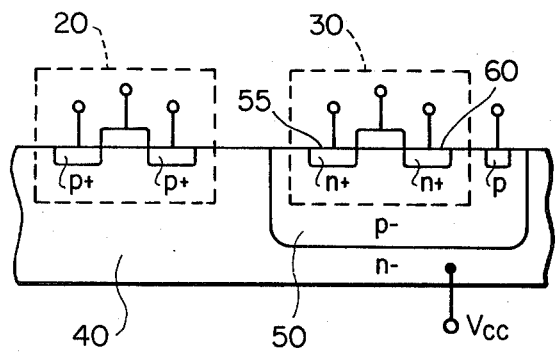
FIG_5
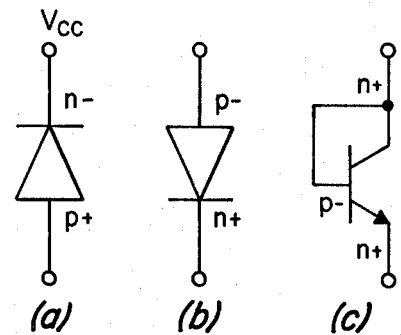
FIG_6
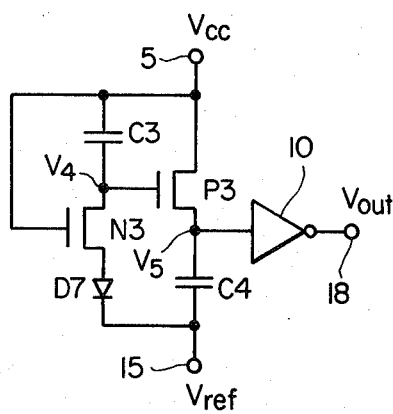
FIG_7
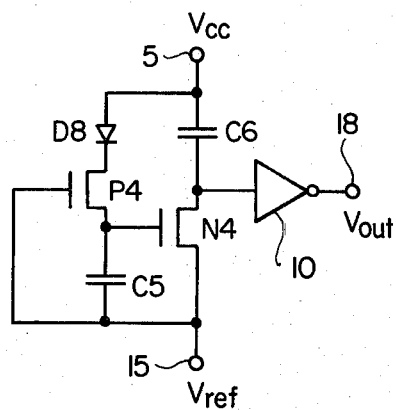
FIG_8

CMOS RESET CIRCUIT

BACKGROUND OF THE INVENTION

1. Field of the Invention

The present invention relates generally to power-on circuits which provide a reset signal to a logic circuit in response to the application of power to the circuit. More specifically, the present invention relates to a power-on circuit adapted for use in CMOS integrated circuits.

2. Description of the Prior Art

Power-on reset circuits provide a reset signal to initialize flip-flops and other logic circuits in response to the application of power to the circuit. Conventional CMOS power-on circuits are designed to insure that a supply voltage sufficient to operate all of the devices in the circuit has been attained before a reset signal is provided. However, these power-on circuits are characterized by two undesirable characteristics. First, the supply voltage which must be attained before a reset signal is provided, i.e., the trip point, of these power-on circuits is typically much higher than the voltage needed for operation of the circuit. For instance, the Motorola MC14541 Programmable Timer specifies that a supply voltage of 8.5 volts is required to reset the circuit. However, threshold voltages for N and P-channel devices are approximately 1-2 volts, thus a supply voltage only slightly greater than 2 volts would be sufficient for proper operation of the circuit. Second, the power required by the conventional power-on circuits is greater than desired. For instance, the Motorola circuit appears to apply a steady state input to the output inverter which has a voltage equal to the supply voltage less a diode drop and a P-channel threshold. This voltage drop is sufficient to turn on both of the devices in the output inverter, which causes the inverter to draw an undesirable steady state DC current.

SUMMARY OF THE INVENTION

The preferred embodiment of the present invention is a CMOS reset circuit having two threshold detector circuits, one for sensing the supply voltage attaining an amplitude sufficient to operate P-channel devices, the other for sensing the supply voltage attaining an amplitude sufficient to operate N-channel devices. The two threshold detector circuits are cascaded to provide a reset signal in response to the supply voltage attaining an amplitude sufficient to operate both N and P-channel devices.

BRIEF DESCRIPTION OF THE DRAWINGS

FIG. 1 is a detailed schematic diagram of a CMOS reset circuit in accordance with the preferred embodiment of the present invention.

FIGS. 2(a) through 2(e) are illustrations of waveforms associated with the circuit of FIG. 1.

FIG. 3 is a detailed schematic diagram of the inverter circuit of FIG. 1.

FIG. 4 is a detailed schematic diagram of the CMOS reset circuit of FIG. 1 with additional features and details.

FIG. 5 is a cross-sectional diagram of a semiconductor substrate illustrating the CMOS process used to implement the preferred embodiment of the present invention.

FIGS. 6(a) through 6(c) illustrate the implementation of diodes in the preferred embodiment of the present invention.

FIG. 7 is a detailed schematic diagram of one alternative embodiment of the present invention.

FIG. 8 is a detailed schematic diagram of another alternative embodiment of the present invention.

DETAILED DESCRIPTION OF THE PREFERRED EMBODIMENT

FIG. 1 is a detailed schematic diagram of a CMOS reset circuit in accordance with the preferred embodiment of the present invention. A supply terminal 5 is coupled to receive a supply voltage $V_{cc}$. The supply terminal 5 is coupled to an anode of diode D1, an anode of diode D2, a first terminal of a capacitor C1 and a power supply input terminal of an inverter 10. A resistor R1 is coupled in series with diode D1 between supply terminal 5 and has a first terminal coupled to a cathode of diode D1 and a second terminal coupled to a reference terminal 15. Reference terminal 15 is coupled to receive a ground voltage $V_{ref}$. A cathode of diode D1 is also coupled to a gate of an N-channel transistor N1. Transistor N1 has its drain coupled to a second terminal of capacitor C1 and its source coupled to reference terminal 15. The second terminal of capacitor C1 is also coupled to a gate of P-channel transistor P1 which has its source coupled to a cathode of diode D2 and its drain coupled to an input of inverter 10 and to a first terminal of a capacitor C2. Capacitor C2 has a second terminal coupled to reference terminal 15 to receive ground voltage $V_{ref}$.

The operation of the circuit of FIG. 1 will be described with reference to voltages at intermediate points in the circuit. These voltages are defined as follows. The voltage at the cathode of diode D1 is designated $V_1$. The voltage at the drain of transistor N1 is designated $V_2$. The voltage at the drain of transistor P1 is designated at $V_3$. Also, the voltage at the output of inverter 10 is designated $V_{out}$.

Initially, voltages $V_1$, $V_2$ and $V_3$ have amplitudes equal to ground voltage $V_{ref}$, as shown in FIG. 2. Supply voltage $V_{cc}$, shown in FIG. 2A, is applied to supply terminal 5. As supply voltage $V_{cc}$ rises in amplitude, a current flows through forward biased diode D1 and resistor R1. This series circuit draws enough current to cause the diode D1 to provide a voltage drop of approximately 0.6 volt between supply terminal 5 and the cathode of diode D1. Thus, voltage $V_1$ tracks supply voltage $V_{cc}$ and has a value equal to supply voltage $V_{cc}$ less the voltage drop across diode D1 as illustrated in FIG. 2B Voltage $V_1$ is also applied to the gate of N-channel transistor N1. N-channel transistor N1 is in its nonconductive state until the gate-to-source voltage across transistor N1 exceeds its voltage threshold $V_{tn}$. This N-channel voltage threshold $V_{tn}$ is in the range of 1 to 2 volts. Thus, when supply voltage $V_{cc}$ exceeds a value equal to the voltage drop across diode D1 and the voltage threshold $V_{tn}$, transistor N1 will conduct.

Voltage $V_2$ is biased by capacitor C1 to a voltage equal to supply voltage $V_{cc}$ while N-channel transistor is in its nonconductive state. However, in response to the N-channel transistor N1 conducting, capacitor C1 discharges and voltage $V_2$ drops to a voltage equal to reference voltage $V_{ref}$ as shown in FIG. 2C.

Voltage $V_2$ is applied to the gate of P-channel transistor P1. Transistor P1 will conduct when the voltage between its gate and source exceeds a P-channel threshold voltage $V_{tp}$, which is also in the range of 1 to 2 volts. Diode D2 is forward-biased, that is, its anode is coupled to supply voltage $V_{cc}$ and its cathode is coupled to reference voltage $V_{ref}$. Thus, P-channel transistor P1 will conduct when the N-channel transistor N1 is conducting and supply voltage $V_{cc}$ exceeds voltage $V_2$ by more than the voltage drop across diode D2 and the P-channel threshold voltage $V_{tp}$ of transistor P1.

Voltage $V_3$, which is initially equal to ground voltage $V_{ref}$, will increase to a voltage equal to supply voltage $V_{cc}$ less the voltage drop across diode D2 in response to transistor P1 conducting and charging capacitor C2. The conducting resistance of transistor P1 and the capacitance of capacitor C2 determine the rate at which capacitor C2 charges and $V_3$ increases. $V_3$, illustrated in FIG. 2D, is applied to the input of inverter 10. Inverter 10 provides an output equal to supply voltage $V_{cc}$ until voltage $V_3$ exceeds the switching voltage of the inverter. This switching voltage of the inverter is approximately equal to $V_{cc}/2$ when $V_{cc}$ is 9 volts. Thus, output voltage $V_{out}$ switches from the high voltage level $V_{cc}$ to the low voltage level $V_{ref}$ in response to voltage $V_3$ attaining a voltage greater than the switching voltage of inverter 10. This provides the reset signal which resets the logic circuits in the integrated circuit.

A detailed schematic diagram of inverter circuit 10 is illustrated in FIG. 3. A P-channel transistor P2 is coupled with its gate coupled to receive the input voltage $V_3$, its source coupled to supply terminal 5 to receive supply voltage $V_{cc}$, and its drain coupled to output terminal 18 to provide output signal $V_{out}$. An N-channel transistor N2 is coupled in series with P-channel transistor P2 with its gate also coupled to receive input voltage $V_3$, its drain coupled to the drain of transistor P2 and to output terminal 18, and its source coupled to reference terminal 15 to receive the reference voltage $V_{ref}$. In operation, output voltage $V_{out}$ is floating until input voltage $V_3$ is sufficient to turn on one of the transistors. When the voltage difference between supply voltage $V_{cc}$ and input voltage $V_3$ is greater than the threshold voltage $V_{tp}$ of transistor P2, transistor P2 conducts and the output voltage $V_{out}$ is normally equal to $V_{cc}$. N-channel transistor N2 conducts when the voltage difference between voltages $V_3$ and $V_{ref}$ exceeds the threshold voltage $V_{tn}$ of transistor N2 and the output voltage $V_{out}$ is normally equal to $V_{ref}$. When both transistors are conducting, output voltage $V_{out}$ has a value intermediate to voltages $V_{cc}$ and $V_{ref}$. The output voltage will thus switch from a voltage approximately equal to supply voltage $V_{cc}$ to a voltage approximately equal to the reference voltage $V_{ref}$ at a switching voltage approximately equal to $V_{cc}/2$. The exact switching voltage is determined by a number of parameters, including the relative sizes of transistors P2 and N2.

In the steady state, that is, subsequent to the reset circuit providing a reset signal, voltage $V_3$ reaches maximum voltage of $V_{cc}$ minus the voltage drop across diode D2. Preferably, P-channel transistor P2 is non-conductive in the steady state and inverter 10 draws no power. This is provided for in the preferred embodiment by selecting diode D2 to have a voltage drop less than the P-channel threshold voltage $V_{tp}$ so that P-channel transistor P2 is off in the steady state condition.

FIG. 4 is a detailed schematic diagram showing the reset circuit of FIG. 1 in greater detail. Resistor R1, which provides a current path for current through forward-biased diode D1, is implemented as an N-channel transistor N4 having its drain coupled to the cathode of diode D1 and its source coupled to reference terminal 15. A capacitance C5 shown in the figure is a parasitic capacitance associated with the drain of the transistor N4 and the gate of transistor N1. This parasitic capacitance is discharged through back-biased diode D4, which has its cathode coupled to supply terminal 5 and its anode coupled to the gate of transistor N1. Thus, voltage $V_1$ will be discharged to supply terminal 5 in response to supply voltage $V_{cc}$ falling to a voltage having amplitude less than the voltage $V_1$ on capacitance C5. Similarly, back-biased diode D5 is coupled to discharge capacitor C1 to supply terminal 5 in response to voltage $V_2$ attaining an amplitude greater than supply voltage $V_{cc}$. Diode D6 is coupled in a similar fashion to discharge capacitor C2, however, due to the CMOS process used in the preferred embodiment, diode D6 is not a discrete device but is a parasitic diode associated with P-channel transistor P1.

In the preferred embodiment of the present invention the transistors are characterized by widths (w) and lengths (l) in mils. Specifically, the preferred widths and lengths of the transistors are given in Table A.

| TRANSISTOR | TYPE | W/L (mils) |
|---|---|---|
| P1 | P-channel | 3/5 |
| P2 | P-channel | 4/.35 |
| N1 | N-channel | .6/.35 |
| N2 | N-channel | 1/.35 |
| N4 | N-channel | .6/.35 |

Capacitor C1 is approximately 1 picofarad. Capacitor C2 is approximately 10 picofarads. A computer simulation of the preferred embodiment of the present invention was characterized by a reset signal occurring approximately 50 microseconds after P-channel transistor P1 began to conduct. The supply voltage was modeled as a voltage ramp having a slope of 1 volt/200 μsec, and P-channel transistor P1 began to conduct at approximately $V_{cc}=2.0$ volts.

FIG. 5 is a cross-sectional diagram of a semiconductor substrate illustrating the CMOS process used to implement the preferred embodiment of the present invention. N$^-$ type substrate 40 is characterized by two transistors 20 and 30. P-channel transistor 20 is constructed by diffusing boron into two P+ regions defining the source and drain. N-channel transistor 30 is constructed by first diffusing boron to construct a P$^-$ region 50. Two N+ regions 55 and 60 are then created by phosphorous diffusion to define drain and source regions of the N-channel transistor 30. Substrate 40 is coupled to receive the supply voltage $V_{cc}$ and becomes the collector of a parasitic bipolar transistor associated with the MOS transistor 30.

FIG. 6 illustrates the implementation of diodes in the preferred embodiment of the present invention. FIG. 6A illustrates a back-biased diode such as diode D4. Diode D4 is constructed from a P-channel transistor 20. Substrate 40 forms the cathode and a P+ region of P-channel transistor 20 forms the anode. A forward-biased diode such as diode D1 is illustrated in FIG. 6B. The forward-biased diode is constructed from an N-channel transistor 30 and is implemented as the base to emitter junction of the parasitic bipolar transistor associated with N-channel transistor 30 as illustrated in FIG. 6C by coupling the base of transistor 30 to its collector.

FIG. 7 illustrates alternative embodiment of the present invention. Supply voltage $V_{cc}$ is applied to supply terminal 5 and is coupled to a gate of N-channel transistor N3, a first terminal of capacitor C3 and to a source of P-channel transistor P3. A second terminal of capacitor C3 is coupled to a drain of transistor N3 and to a gate of transistor P3. A forward-biased diode D7 is coupled in series between a source of transistor N3 and reference terminal 15. A drain of transistor P3 is coupled to an input of inverter 10 and to a first terminal capacitor C4, which has a second terminal coupled to reference terminal 15.

In operation, transistor N3 conducts in response to supply voltage $V_{cc}$ attaining a voltage greater than the voltage drop across forward-biased diode D7 and the threshold voltage $V_{tn}$ of the N-channel transistor N3. Capacitor C3 discharges in response to transistor N3 conducting until voltage $V_4$ at the drain of transistor N3 equals the reference voltage $V_{ref}$ plus the voltage drop across diode D7. P-channel transistor P3 conducts in response to the voltage drop across the gate and source of transistor P3 exceeding its threshold voltage $V_{tp}$. When capacitor C3 is completely discharged, voltage $V_4$ will be substantially equal to the reference voltage $V_{ref}$ plus the voltage drop across the forward-biased diode D7. P-channel transistor P3 conducts when the N-channel transistor is conducting and the supply voltage $V_{cc}$ exceeds a P-channel threshold $V_{TP}$ plus a diode drop. Thus, the circuit of FIG. 7 responds like the circuits of 1 and 4; that is, it provides a reset signal in response to the supply voltage $V_{cc}$ attaining an amplitude greater than both an N-channel threshold plus a diode drop and a P-channel threshold plus a diode drop. However, as illustrated in FIGS. 5 and 6, diode D7 is implemented as a forewarded-biased diode as illustrated in FIGS. 6B and 6C. Since in the preferred process the substrate, thus the collectors of all bipolar parasitic transistors associated with N-channel transistors, is coupled to supply terminal 5, diode D7 cannot be realized. However, by using a process which provides for isolated diodes, the circuit of FIG. 7 could be realized by a person skilled in the art.

FIG. 8 is a detailed schematic diagram of another alternative embodiment of the present invention wherein two threshold detectors are cascaded with the P-channel threshold detector first. That is, the N-channel threshold detector, comprising N-channel transistor N5, will not conduct unless the P-channel threshold conductor, comprising P-channel transistor P4, is conducting, and the supply voltage $V_{cc}$ exceeds an N-channel threshold voltage $V_{tn}$ by more than one diode drop. Specifically, forward-biased diode D8 has an anode coupled to supply terminal 5 and a cathode coupled to a source of P-channel transistor P4. Transistor P4 has its gate coupled to reference terminal 15 and its drain coupled to a gate of N-channel transistor N5 and to a first terminal of a capacitor C5, which has its second terminal coupled to reference terminal 15. Transistor N5 has a source coupled to reference terminal 15 and a drain coupled to the first terminal of capacitor C6 and to an input of inverter 10. Capacitor C6 has its second terminal coupled to supply terminal 5.

In operation, the circuit of FIG. 8 provides a reset signal in response to the supply voltage $V_{cc}$ attaining the desired trip point voltage. However, as a result of inverting the order of the cascaded threshold detector circuits, the output voltage $V_{out}$ switches from a low amplitude $V_{ref}$ to a high amplitude $V_{cc}$ to indicate the reset.

In the circuits of FIGS. 7 and 8, it is also desirable to provide diodes to discharge the capacitors as was illustrated in FIG. 4. These back-biased diodes are coupled to discharge the capacitors in response to the supply voltage $V_{cc}$ falling to a voltage lower than the voltage on the node to be discharged.

The above description is exemplary rather than limiting and other embodiments and equivalents of the present invention, as defined by the claims, may now be apparent to a person skilled in the art. Accordingly, the claims should be interpreted as covering all embodiments and equivalents which fall within the spirit and scope of the invention.

I claim:

1. A CMOS integrated power-on reset circuit for providing an output signal in response to the application of a voltage across a supply terminal and a reference terminal; the circuit comprising:

a first circuit comprising a first capacitor having a first terminal and a second terminal, a first N-channel transistor having a drain coupled to the second terminal of the first capacitor, a source coupled to the reference terminal, and a gate, and first circuit means including a forward-biased diode coupled between the supply and reference terminals in series circuit with the gate and source of the first N-channel transistor;

a second circuit comprising a second capacitor having a first terminal coupled to the reference terminal and a second terminal, a first P-channel transistor having a drain coupled to the second terminal of the second capacitor, a source coupled to the supply terminal, and a gate, and second circuit means including a forward-biased diode coupled between the supply and reference terminals in series circuit with the source of the first P-channel transistor;

inverter means comprising a second P-channel transistor coupled in series circuit with a second N-channel transistor between the supply and reference terminals, the gates of the second transistors coupled, for providing the output signal in response to the voltage applied to the gates of the second transistors;

wherein the second terminal of the capacitor of one of the first and second circuits is coupled to the gate of the transistor of the other of the first and second circuits and the second terminal of the capacitor of the other circuit is coupled to the gates of the second transistors.

2. A CMOS integrated power-on reset circuit as in claim 1 further comprising a back-biased first diode coupled between the second terminal of the first capacitor and the supply terminal and a back-biased second diode coupled between the second terminal of the second capacitor and the supply terminal.

3. A CMOS integrated power-on reset circuit as in claim 2 wherein the forward-biased diode of the first circuit means comprises a forward-biased third diode having an anode coupled to the supply terminal, a cathode coupled to the gate of the first N-channel transistor, and impedance means coupled between the cathode of the forward-biased third diode and the reference terminal for providing a current path therebetween.

4. A CMOS integrated power-on reset circuit as in claim 3 wherein the forward-biased diode of the second circuit means comprises a forward-biased fourth diode having an anode coupled to the supply terminal and a cathode coupled to the source of the first P-channel transistor.

5. A CMOS integrated power-on reset circuit as in claim 4 wherein the second terminal of the first capacitor is coupled to the gate of the first P-channel transistor and the second terminal of the second capacitor is coupled to the gates of the second transistors.

6. A CMOS integrated power-on reset circuit as in claim 5 wherein the impedance means comprises a third N-channel transistor having a gate coupled to the drains of the second P-channel and N-channel transistors, a drain coupled to the cathode of the third diode, and a source coupled to the reference terminal, the circuit further comprising a back-biased fifth diode coupled between the cathode of the third diode and the supply terminal.

7. A CMOS integrated power-on reset circuit as in claim 6 wherein the voltage drop across the forward-biased fourth diode is less than the threshold voltage of the second P-channel transistor.

8. A CMOS integrated power-on reset circuit for providing an output signal in response to the application of a voltage across a supply terminal and a reference terminal, the circuit comprising:
- a first circuit comprising a first first capacitor having a first terminal coupled to the supply terminal and a second terminal, a first N-channel transistor having a drain couple to the second terminal of the first capacitor, a source coupled to the reference terminal, and a
- a second circuit comprising a second capacitor having a first terminal coupled to the reference terminal and second terminal, a first P-channel transistor having a drain coupled to the second terminal of the second capacitor, a source coupled to the supply terminal, and a gate;
- inverter means comprising a second P-channel transistor coupled in series with a second N-channel transistor between the supply and reference terminals, the gates of the second transistors coupled, for providing the output signal in response to the voltage applied to the gates of the second transistors;

wherein the second terminal of the capacitor of one of the first and second circuits is coupled to the gate of the transistor of the other of the first and second circuits and the second terminal of the capacitor of the other circuit is coupled to the gates of the second transistors;
further comprising a forward biased diode having an anode coupled to the supply terminal and a cathode coupled to the source of the first P-channel transistor, the gate of the first P-channel transistor coupled to the reference terminal, the second terminal of the second capacitor coupled to the gate of the first N-channel transistor, and the second terminal of the first capacitor coupled to the gates of the second transistors.

9. A CMOS integrated power-on reset circuit as in claim 8 wherein the voltage drop across the forward-biased diode is less than the threshold voltage of the second P-channel transistor.

10. A CMOS integrated power on reset circuit for providing an output signal in response to the application of a voltage across a supply terminal and a reference terminal, the circuit comprising:
- a first voltage reference circuit coupled between said supply and said reference terminal, including a first MOSFET and a first diode connected thereto for establishing a first threshold voltage;
- a second voltage reference circuit coupled between said supply and said reference terminal and a terminal of said first voltage reference circuit and including a second MOSFET of complementary type of said first MOSFET and a second diode connected thereto for establishing a second threshold voltage;
- a CMOS inverter circuit connected to the output of said second voltage reference circuit and providing the output of said reset circuit in response to said supply terminal voltage exceeding the higher of said first or second threshold voltage.

11. A CMOS power on reset circuit as claimed in claim 10 wherein the gate of said second MOSFET is coupled to a terminal of said first MOSFET, said first MOSFET terminal carrying a voltage which is responsive to the voltage on the gate of said first MOSFET.

* * * * *